United States Patent
Baxter et al.

(10) Patent No.: US 6,211,945 B1
(45) Date of Patent: Apr. 3, 2001

(54) APPARATUS AND METHOD FOR EXPOSING SUBSTRATES

(75) Inventors: Gregory R. Baxter, Orange; James H. Beauchene, Norco; Eugene J. Melbon, Glendora; Victor M. Jacobo, West Covina, all of CA (US)

(73) Assignee: ORC Technologies, Inc., Azusa, CA (US)

( * ) Notice: Subject to any disclaimer, the term of this patent is extended or adjusted under 35 U.S.C. 154(b) by 0 days.

(21) Appl. No.: 09/081,520

(22) Filed: May 19, 1998

(51) Int. Cl.[7] .............................. G03B 27/42; G03B 27/62
(52) U.S. Cl. .................................................. 355/53; 355/75
(58) Field of Search ................................ 355/53, 67, 72, 355/73, 74, 75, 76, 474; 414/935–941

(56) References Cited

U.S. PATENT DOCUMENTS

| | | | |
|---|---|---|---|
| 4,937,678 | * | 6/1990 | Murai et al. .......................... 358/296 |
| 4,954,913 | * | 9/1990 | Kajita ..................................... 358/474 |
| 4,989,035 | * | 1/1991 | Leonhard .............................. 355/93 |
| 5,006,886 | * | 4/1991 | Suzuki ................................... 355/46 |
| 5,126,787 | * | 6/1992 | Irie et al. ............................... 355/75 |
| 5,241,183 |   | 8/1993 | Kanai et al. ..................... 250/453.11 |
| 5,530,516 | * | 6/1996 | Sheets .................................... 355/53 |
| 5,686,997 | * | 11/1997 | Shirasu ................................. 356/401 |
| 5,726,738 | * | 3/1998 | Sohn et al. ............................. 355/53 |
| 5,726,739 | * | 3/1998 | Hayata ................................... 355/67 |
| 5,798,822 | * | 8/1998 | Miyazaki et al. ...................... 355/53 |
| 5,923,409 | * | 7/1999 | Hamada et al. ....................... 355/72 |

FOREIGN PATENT DOCUMENTS

| | | |
|---|---|---|
| 63-174046 | 7/1988 | (JP) . |
| 2-42426 | 3/1990 | (JP) . |
| 5-102011 | 4/1993 | (JP) . |
| 8-15866 | 1/1996 | (JP) . |

* cited by examiner

Primary Examiner—Russell Adams
Assistant Examiner—Hung Henry Nguyen
(74) Attorney, Agent, or Firm—Christie, Parker & Hale, LLP

(57) ABSTRACT

An apparatus and method for the proximity photolithography of large substrates is provided. The apparatus includes a mask frame for holding the mask in a substantially vertical position. A tiltable platen is provided for receiving a photoresist-coated substrate in a horizontal position. The platen includes a vacuum chuck for holding the substrate to the platen. The platen is tilted in order to place the substrate in a position parallel to the mask. A motor is used to move the mask into close proximity with the substrate and a scanning exposure is begun. The scanning exposure is accomplished by a rail-mounted shuttle which holds equipment for producing a collimated light beam. A servo motor drives the shuttle along the rail to perform the scanning exposure. Once the exposure is completed, the mask is moved away from the exposed substrate and the platen is lowered to its horizontal position. The vacuum chuck disengages the exposed substrate which is then transported from the platen. The platen can then receive a second substrate for exposure and the procedure can be repeated until a particular lot of substrates has been exposed.

30 Claims, 12 Drawing Sheets

APPARATUS AND METHOD FOR EXPOSING SUBSTRATES

FIELD OF THE INVENTION

The present invention relates to equipment and methods for the photolithography of photoresist-coated substrates such as those used for plasma display television screens.

BACKGROUND OF THE INVENTION

The exposure of small substrates such as those used for plasma display screens is generally performed with both the substrate and the photo tool or mask in a horizontal position by a single exposure from a vertically directed collimated light beam. However, for a number of reasons, such methods do not work well for large panels such as those used for large plasma display television screens. One problem is that for a large substrate, it is difficult to provide a collimated light beam of a sufficient size to permit the single exposure of the substrate at a uniform intensity over its entire surface. Another problem is that when a large mask is held in a horizontal mask frame for exposure of a substrate, the center of the mask tends to sag due to its weight. Similarly, unless it is properly supported, a horizontal substrate will tend to sag. Any such sagging in the mask or substrate makes the accurate photolithography of the substrate virtually impossible.

While a number of manufacturing techniques have been developed in attempts to avoid these problems, such techniques have proven to be difficult and costly to implement. Moreover, current methods do not generally permit the quick and accurate exposure of a large number of large substrates in an automated fashion.

Generally, the methods for exposing large substrates have required either scanning the entire surface of the panel with a moving beam and/or using a fixed beam and moving the mask and substrate so as to expose the substrate's entire surface by a scanning procedure. These scanning methods include the "step and repeat" method in which specific portions of the panel are sequentially exposed in incremental steps, each step by a timed exposure. Other methods include a continuous scan in which the substrate and light beam are moved with respect to one another in a moving exposure. One such continuous scan method moves the mask and substrate over a serpentine path to expose the substrate to a fixed collimated light beam in a single exposure until the entire substrate has been exposed.

Both step and repeat and continuous scan methods of exposure often lead to stitching errors, that is, errors where discrete lines of overexposure or underexposure are left in the substrate where adjacent paths of the collimated light beam do not perfectly mesh with one another. To the extent stitching errors can be reduced, these basic methods are nonetheless time consuming and often difficult to consistently repeat for a large batch of substrates. Problems with repeatability lead to the frequent rejection of substrates for failing to meet minimum quality control standards.

With regard to the problem of mask sagging when a large mask is held in a horizontal position for exposure of a substrate using a vertical light beam, this problem has largely been overcome through the use of a generally horizontal beam of exposure light that is directed through a mask and substrate held in a generally vertical orientation. However, when the mask and substrate are held perfectly vertical, they tend to be unstable and difficult to hold motionless during the exposure. The stability of the mask and substrate can be improved while reducing sag by holding the mask and substrate in planes that are slightly out of vertical. Nevertheless, while sag problems can generally be avoided by these methods, the handling of large, vertically oriented masks and substrates has proven to be difficult. These problems in handling make conventional exposure methods for large substrates costly, time consuming and unreliable.

Yet another difficulty with existing methods for exposing large substrates has been that such exposures must generally be done in a clean room so as to avoid contaminating either the mask or the photoresist coating on the substrate with dust or dirt. Because the equipment associated with the exposure of large substrates is very large, it is often difficult and costly to fit such equipment within a clean room. Moreover, once the equipment is installed in a clean room, any routine maintenance can be difficult and costly due to the steps that must be taken in maintaining the clean room atmosphere.

An improved apparatus and method for exposing large photoresist-coated substrates quickly, reliably and at low cost is desired.

SUMMARY OF THE INVENTION

According to the present invention, an improved apparatus and an improved method for exposing large photoresist-coated substrates are provided. The apparatus includes two key components: a light scanning assembly, and a mask and substrate handling assembly. One important advantage to the apparatus is that the two key components need not be physically located in the same room. Therefore, only the mask and substrate handling equipment need to be located in a clean room. The light source can be located in an adjacent room. By locating the light source outside the clean room the ability to perform routine maintenance on the light scanning assembly is greatly simplified.

According to the invention, the mask and substrate handling assembly includes a frame for holding the mask in a substantially vertical position. The mask is held in place on the frame by a vacuum chuck. It is generally desired to hold the mask at an angle slightly out of vertical, preferably about 2 degrees from vertical, in order to effectively eliminate sag while improving the stability of the mask. The 2 degree angle is achieved by mounting the frame perpendicularly to a ramp with a 2 degree slope from horizontal. The ramp is mounted on a base that is preferably anchored to a block of a heavy material such as granite so as to damp out any vibrations from the building in which the equipment is located. The frame is mounted to the ramp with slide bearings and a positioning table driven by a stepper motor is provided to enable the frame to be moved up and down the ramp.

A tiltable substrate platen, also mounted on the base, is provided for receiving the photoresist-coated substrate in a generally horizontal position. The platen includes pneumatically-driven snubbing pins which cooperate with banking pins to center the substrate on the platen. A vacuum chuck is provided on the platen to hold the centered substrate firmly in place. The side of the platen proximate the frame is hinged to permit the substrate to be tilted into a position parallel to the mask. The platen is tilted by a servo-driven jack screw assisted by a pair of pneumatic lift assists. Preferably, the mask and substrate are oriented with respect to one another so that the preferred 2 degree tilt of the mask is in the direction of the substrate.

The mask and substrate handling assembly further includes equipment for automatically moving a substrate into position on the platen. A horizontal in-feed conveyor is provided adjacent the platen with a plurality of drive rollers to feed a substrate to the platen. In order to assist the platen in receiving the substrate from the in-feed conveyor, the platen includes a plurality of retractable wheels which can be extended up from the surface of the platen and driven by a motor to assist in maneuvering the substrate to the proper position on the platen. The wheels retract to lower the substrate so that it can be held in place by the vacuum chuck. Similar to the in-feed conveyor, an out-feed conveyor is provided adjacent the platen to withdraw the exposed substrate from the platen for further processing. Like the in-feed conveyor, the out-feed conveyor includes a plurality of drive rollers for manipulating the exposed substrate.

The light scanning assembly includes collimated light beam projection equipment mounted on a shuttle. The collimated light beam projection equipment includes a lamphouse which directs a beam of ultra violet light to a reflecting mirror which, in turn, directs the light beam to a collimating mirror. The equipment is mounted on the shuttle so that the collimated light beam from the collimating mirror will be directed perpendicular to the mask. In the preferred embodiment, the collimated light beam is directed at a 2 degree angle from horizontal. The collimated light beam provided by this equipment is of a sufficient height to permit the entire substrate to be exposed in a single and continuous horizontal pass.

In order to permit an accurate horizontal scan of the substrate, the shuttle is mounted on a plurality of horizontal rails. The shuttle is moved along the rails by a screw which is driven by a servo motor.

In the preferred embodiment the apparatus is automated through the use of a microprocessor. In order to expose a batch of large photoresist-coated substrate material, a first sheet of substrate is driven by the rollers of the in-feed conveyor toward the platen. The retractable wheels of the platen are extended to receive the substrate which is then moved by the wheels toward the center of the platen. Once positioned, the wheels are retracted and the snubbing pins are engaged to center the substrate on the platen against the banking pins. Once centered, the vacuum chuck is engaged to hold the substrate to the platen. The substrate is then tilted to a position parallel to the mask using the servo-driven jack screw and pneumatic lift assists.

Once the substrate has been tilted into position, the mask is moved into close proximity with the substrate by moving the frame down the ramp using the positioning table. The precise spacing between the mask and substrate can be achieved through a number of different ways. In one embodiment, gap sensors can be used to determine the spacing between the mask and substrate and control the movement of the mask toward the substrate. However, in the preferred embodiment, a set of shims are provided on the mask which abut against the substrate to provide the proper gap between the mask and substrate. Once the substrate and mask are in proximity to one another, the scanning exposure can begin. The speed at which the shuttle is driven along the track can be used to control the exposure level and can also be used to compensate for output losses from the light source which commonly occur with the aging of the UV lamp elements.

Once an exposure is complete, the frame is pushed up the ramp to separate the mask from the substrate. The platen is then tilted back to its horizontal position and the vacuum chuck is disengaged to release the substrate. The retractable wheels are then extended and used to drive the exposed substrate to the out-feed rollers which withdraw the substrate from the platen for further processing. Simultaneously, the in-feed rollers are engaged to feed a second substrate to the platen. The process is repeated with one difference being that the second substrate is exposed with a scan in a direction opposite to that of the first substrate. By scanning the odd substrates in a first direction, for example, from left to right, and the even substrates in a second direction, right to left, a large number of substrates can more rapidly be exposed while reducing the travel of the shuttle.

In the preferred embodiment, the frame further includes alignment equipment which is especially useful with substrates requiring multiple exposures. For such multiple exposures, it is critical that the mask pattern for a particular exposure be precisely aligned with the patterns of any previous exposures. The alignment equipment permits the manipulation of the mask within its plane in up and down, side to side and rotational directions. However, this manipulation is all maintained in the same plane so that the mask and substrate will remain parallel to one another during exposure. Such manipulation is accomplished by using a mask frame made up of a front frame that is adjustably mounted to a back frame. In such an embodiment, the back frame is slidably mounted to the ramp and the front frame is mounted to the back frame with a plurality of positioning tables driven by stepper motors to permit the desired movement of the front frame with respect to the back frame. Both the movement of the front frame up and down in the plane of the mask as well as the rotational movement of the front frame in the plane of the mask are accomplished by a pair of generally vertical positioning tables mounted on the right and left sides of the front frame. Movement of the front frame from side to side is accomplished by a horizontal positioning table. Stacked bearing assemblies including slide and roller bearings help provide rigidity in coupling the front frame to the back frame while permitting the desired movement between the two.

The alignment equipment further includes a plurality of optical sensors which are used to measure the alignment between a mask and substrate. When a substrate is to be subjected to multiple exposures, the first exposure is performed with a mask designed to provide a target at each of the four corners of the substrate. Similar targets are provided on subsequent masks. While the alignment between the mask and substrate is generally not critical for the first exposure, when the substrate is to be exposed for second and perhaps further exposures, the targets on the substrate need to be precisely aligned with the targets on the subsequent masks to ensure that the finished pattern for the substrate is accurate.

Preferably, four optical sensors are provided at the four corners of the frame. The sensors are mounted on retractable arms so as they can be retracted out of the way during scanning. Once the mask frame has been slid down the ramp to place the mask and substrate in proximity with one another, each optical sensor is extended on its respective arm so that it can take a reading to measure the alignment between the targets of the mask and substrate. Signals are sent from the optical sensors to the microprocessor which determines the extent of misalignment and calculates a desired manipulation of the front frame with respect to the back frame to correct any error in alignment. The back frame is then slid up the ramp to move the mask and substrate away from one another. The positioning tables mounting the front frame to the back frame are then manipulated according to signals generated by the microprocessor. The back frame is then slid down the ramp again to place the mask and substrate back into proximity with one another and the optical sensors are again engaged to send new signals to the microprocessor. At this point, the microprocessor will either confirm that the mask and substrate have been aligned within a given tolerance, or calculate new manipulations for the positioning tables. This procedure is repeated until an acceptable tolerance is achieved. The mask and substrate should generally be disengaged from one another between adjustments of the positioning tables so as to avoid damage to the shims by any abrasion between the substrate and the shims. Such damage could adversely affect the accuracy of later exposures.

Various additional sensors and feedback devices are also preferably used along with microprocessor and the other devices mentioned above to keep the system operating automatically so that a large number of large area substrates can be processed quickly and accurately. The present invention dramatically decreases the amount of time taken to expose a batch of large area substrates yet reliably provides accurate exposures of the substrates, even where multiple exposure of a given substrate is required.

DETAILED DESCRIPTION OF THE INVENTION

Figure 1:
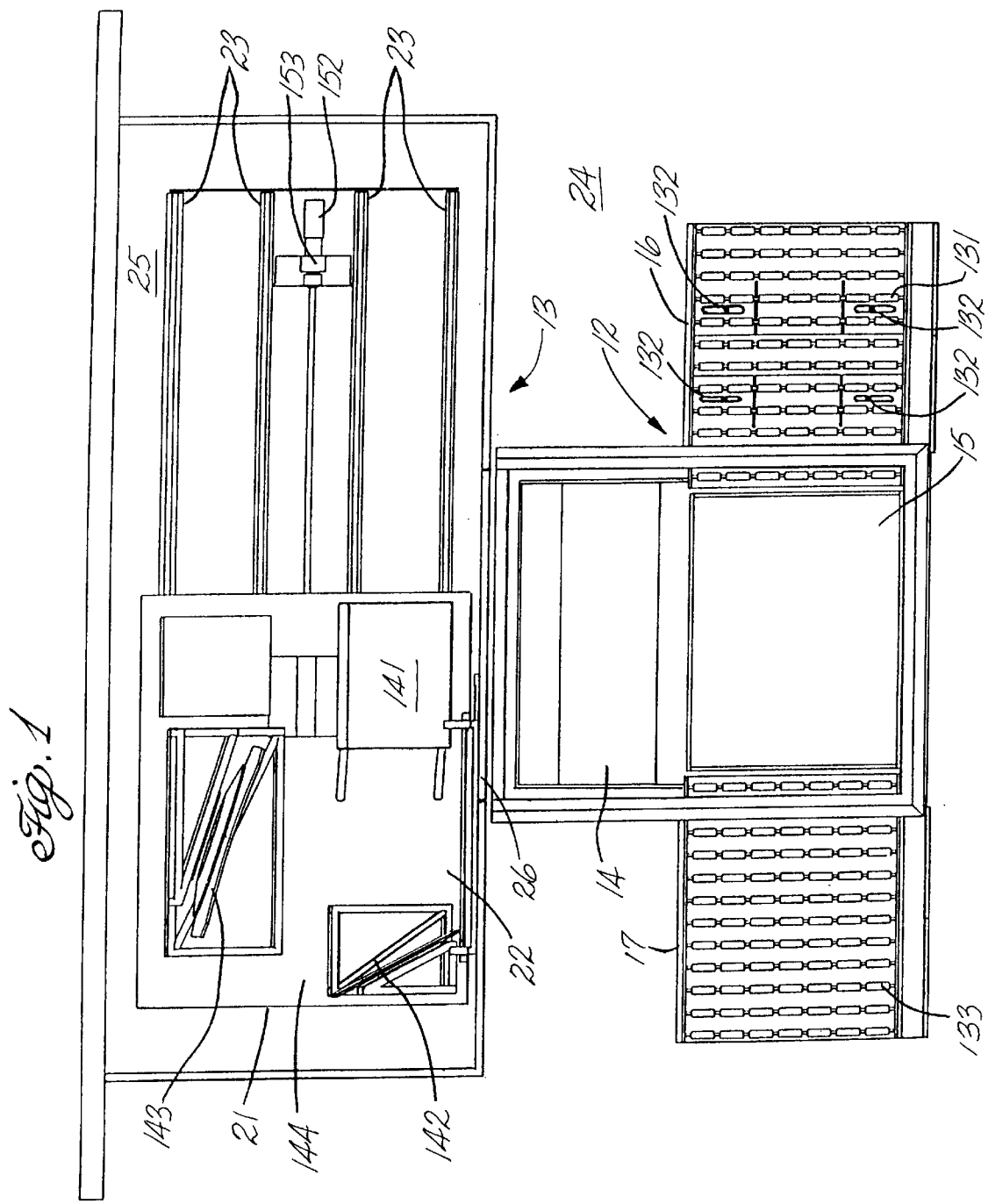
FIG. 1 is a partially schematic plan view of the equipment used in practicing the present invention.

As illustrated somewhat schematically in FIG. 1, the invention includes two key components: a mask and substrate handling assembly 12 and a scanning assembly 13. The mask and substrate handling equipment includes a generally vertical mask frame 14 for holding the mask during exposure and a tiltable substrate platen 15 for manipulating the substrate from a generally horizontal position to a position parallel with the mask frame. A substrate in-feed conveyor 16 for feeding an unexposed substrate to the platen and a substrate out-feed conveyor 17 for removing the exposed substrate from the platen are optionally provided to assist in the automated handling of a large number of substrates for exposure to a mask.

The scanning assembly generally includes collimated light beam generation equipment 21 mounted on a shuttle 22 which travels along rails 23 to permit a scanning exposure of the substrate to be performed.

In the preferred embodiment, the mask and substrate handling assembly is located in a clean room 24 while the scanning assembly is located in an adjacent room 25. By isolating the scanning assembly from the mask substrate handling equipment, maintenance and upkeep of the scanning assembly is simplified. The clean room which houses the mask and substrate handling equipment preferably includes down draft air flow from ceiling mounted HEPA filters through a perforated floor. Such clean room designs are well known in the art.

Because the equipment is housed in two separate rooms, in order to permit the collimated light beam to be directed to the substrate, an open window 26 the approximate size of the largest mask to be used by the equipment is provided between the clean room and the adjacent room. By keeping the pressure of the clean room slightly higher than that of the adjacent room, a portion of the air in the clean room will flow from the clean room through the open window and into the adjacent room to ensure that the clean room atmosphere is not compromised. Optionally, sliding doors (not shown) can be provided to cover and seal the open window during long periods of shut down or equipment maintenance to further assist in maintaining the clean room atmosphere.

As an alternative, rather than using an open window between the clean room and the room housing the scanning assembly, a transparent window can be provided. However, an open window is generally preferred as it avoids the possibility of optical distortion which may result from the use of a transparent window, even if such a transparent window is made from a high quality optical material.

Figure 2:
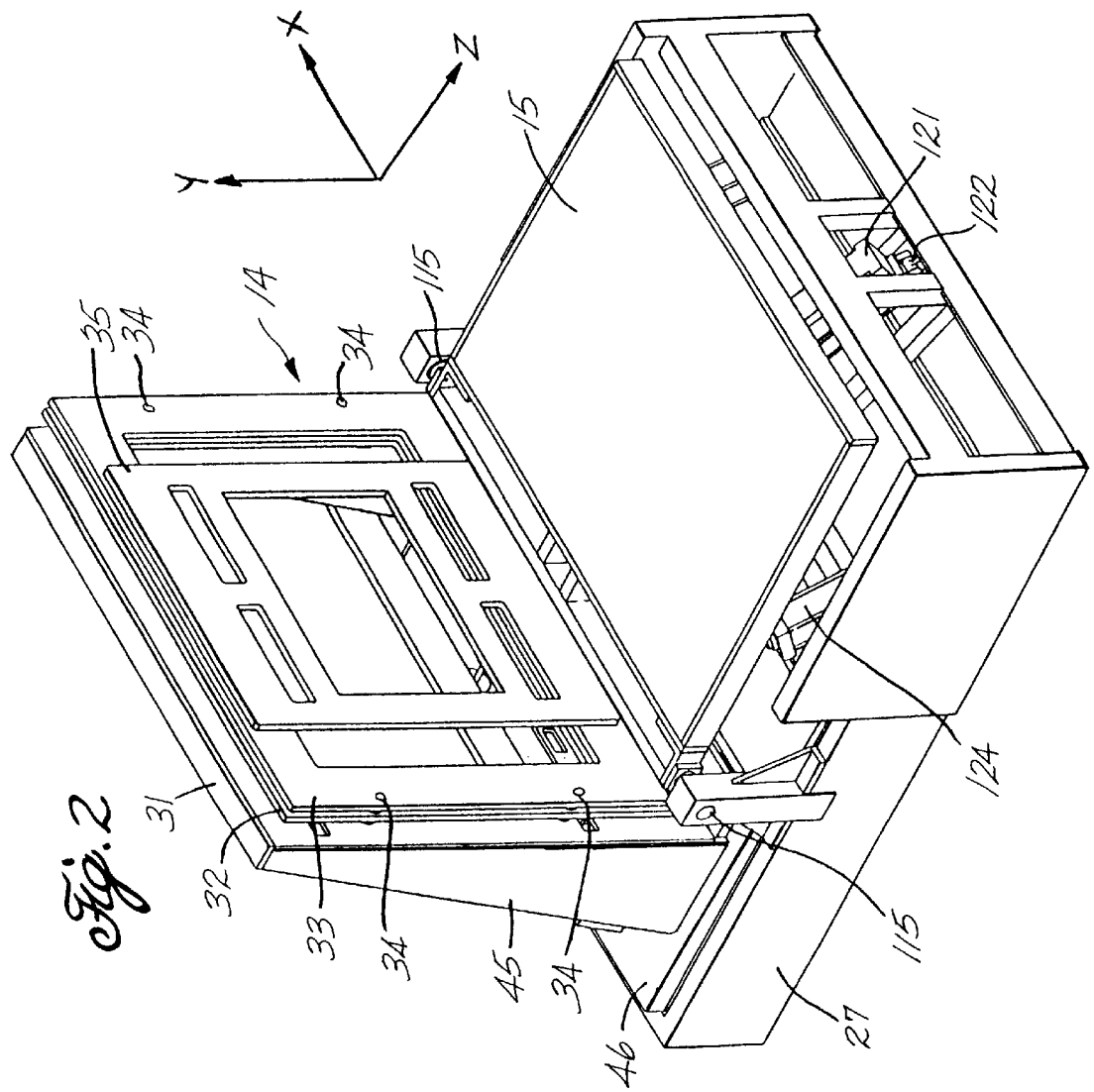
FIG. 2 is a front perspective view of the mask frame and platen assemblies.

Referring to FIG. 2, in order to keep the mask and substrate still during exposure and isolate the mask and substrate handling equipment from any external vibrations, the mask frame and the platen are mounted on a base 27, preferably of aluminum, which is itself mounted to a large block of heavy material such as granite. The use of such a base effectively damps out external vibrations to ensure that an accurate scan can be made.

To simplify the discussion of the of the various components a number of axes are defined at FIG. 2. The horizontal axis parallel to the bottom of the plane of the mask is generally referred to as the x-axis. The substantially vertical axis parallel to the plane of the mask and perpendicular to the x-axis is generally referred to as the y-axis. The substantially horizontal axis that is perpendicular to the x- and y-axes is the z-axis.

Referring to FIGS. 2–5, the mask and substrate handling assembly 12 includes a generally vertical mask frame 14 which is preferably about 2 degrees out of vertical, leaning in the direction of the platen 15. The mask frame is actually made up of a plurality of individual frames, a back frame 31, a front frame 32 and a planarization frame 33, each of which is made from a plate of aluminum with a cutout the approximate size of the largest mask pattern to be accommodated by the equipment. In the preferred embodiment the equipment is generally designed to accommodate a mask large enough for the photolithography of a substrate for use in a 78 inch diagonal plasma display television screen.

The planarization frame is the portion of the mask frame that actually receives the mask and is mounted to the front frame with four planarization bolts 34. The planarization bolts are used for fine adjustments of the orientation of the mask with respect to the front frame in order to ensure that the mask will be held precisely in a plane parallel to the plane of the substrate.

In order to permit the equipment to be used for smaller exposures, an adapter frame 35 can be mounted to the planarization frame of the mask frame. Various different sizes of adapter frames can be provided to accommodate the exposure of different sizes of substrates. The adapter frame illustrated is designed to accommodate the mask used for the photolithography of substrates used for the screens of 42 inch diagonal plasma display television screens.

For a large mask, a mask chuck is provided on the planarization frame to hold the mask in place. For a smaller mask, a smaller mask chuck is provided on the adapter frame. Preferably the chucks are vacuum chucks in which the mask is held in place by the use of a vacuum.

Figure 11:
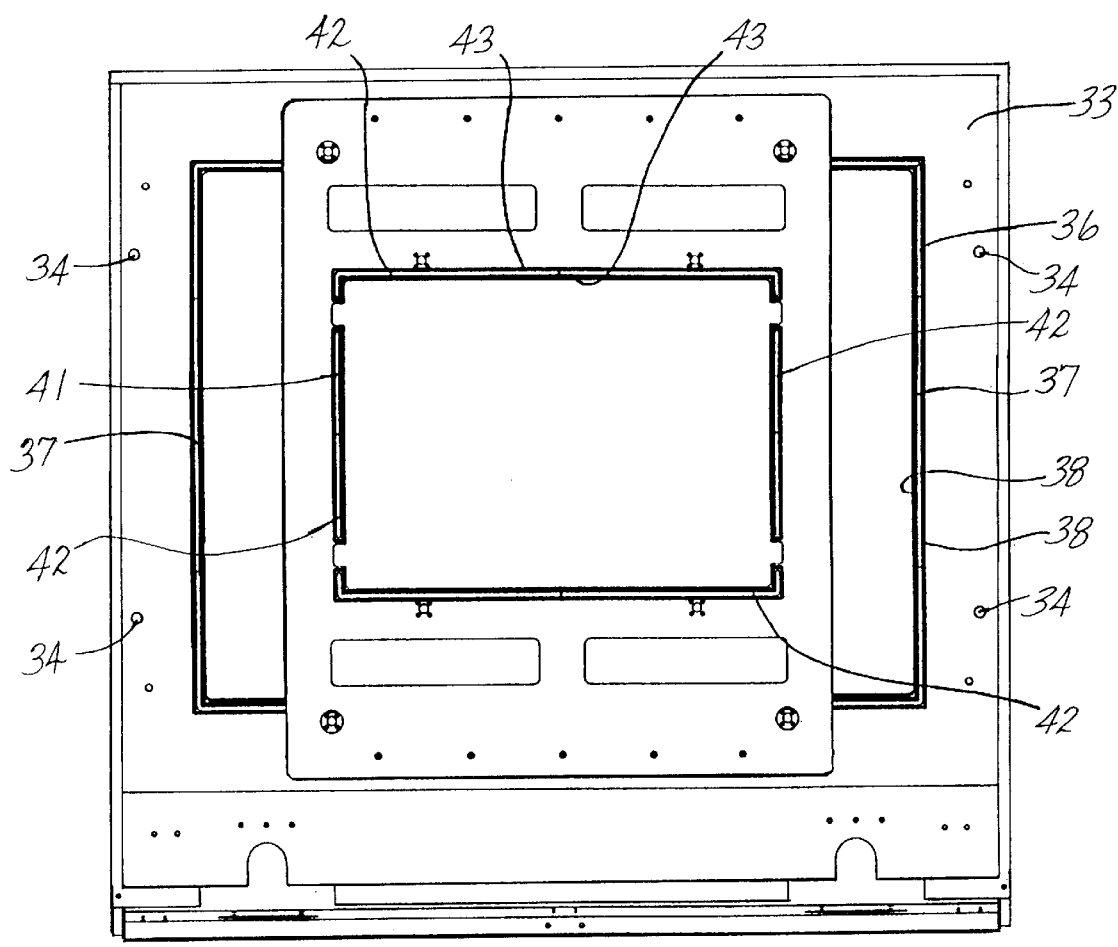
FIG. 11 is a front elevation view of the mask frame.

Referring to FIG. 11, in the preferred embodiment, a large mask is held in place on the planarization frame by a vacuum mask chuck 36. The vacuum mask chuck includes one or more channels 37 around the perimeter of the frame with gaskets 38 on either side of each channel to permit an airtight seal between the mask chuck and the mask. When a vacuum is applied to the channels from a vacuum source (not shown) with the mask in place, the mask is held against the planarization frame by atmospheric pressure. While the vacuum mask chuck will normally hold the mask in position, backup clamps (not shown) can also be provided to prevent the mask from falling in the event there is a failure of the vacuum system.

As mentioned, when an adapter frame is to be used, it preferably includes a vacuum mask chuck 41 similar to that provided on the planarization frame. The vacuum mask chuck includes vacuum channels 42, each with a pair of gaskets 43 for providing a good seal between the adapter frame and the mask. The application of a vacuum to the channels will hold the mask in place against the adapter frame. Backup clamps (not shown) can also be provided on the adapter frame to prevent the mask from falling from the adapter frame if there is a loss of vacuum. Note that for the sake of clarity, the details of the vacuum mask chucks are omitted from FIGS. 2, 3 and 6.

The back frame of the mask frame is affixed perpendicularly to a slide plate 44 and reinforced by a pair of gussets 45. The slide plate is slidably mounted to a ramp 46 fixed to the base. The slope of the ramp is parallel to the z-axis which is preferably 2 degrees from horizontal. The ramp provides the slight forward lean of the mask frame. The slide plate is mounted to the ramp on three slide bearings 47 which permit the frame to be slid up or down the ramp. Preferably, the slide bearings are positioned on the ramp at the vertices of a triangle on the surface of the ramp to improve the stability of the mask frame. Suitable slide bearings are steel crossed roller slides.

Figure 3:
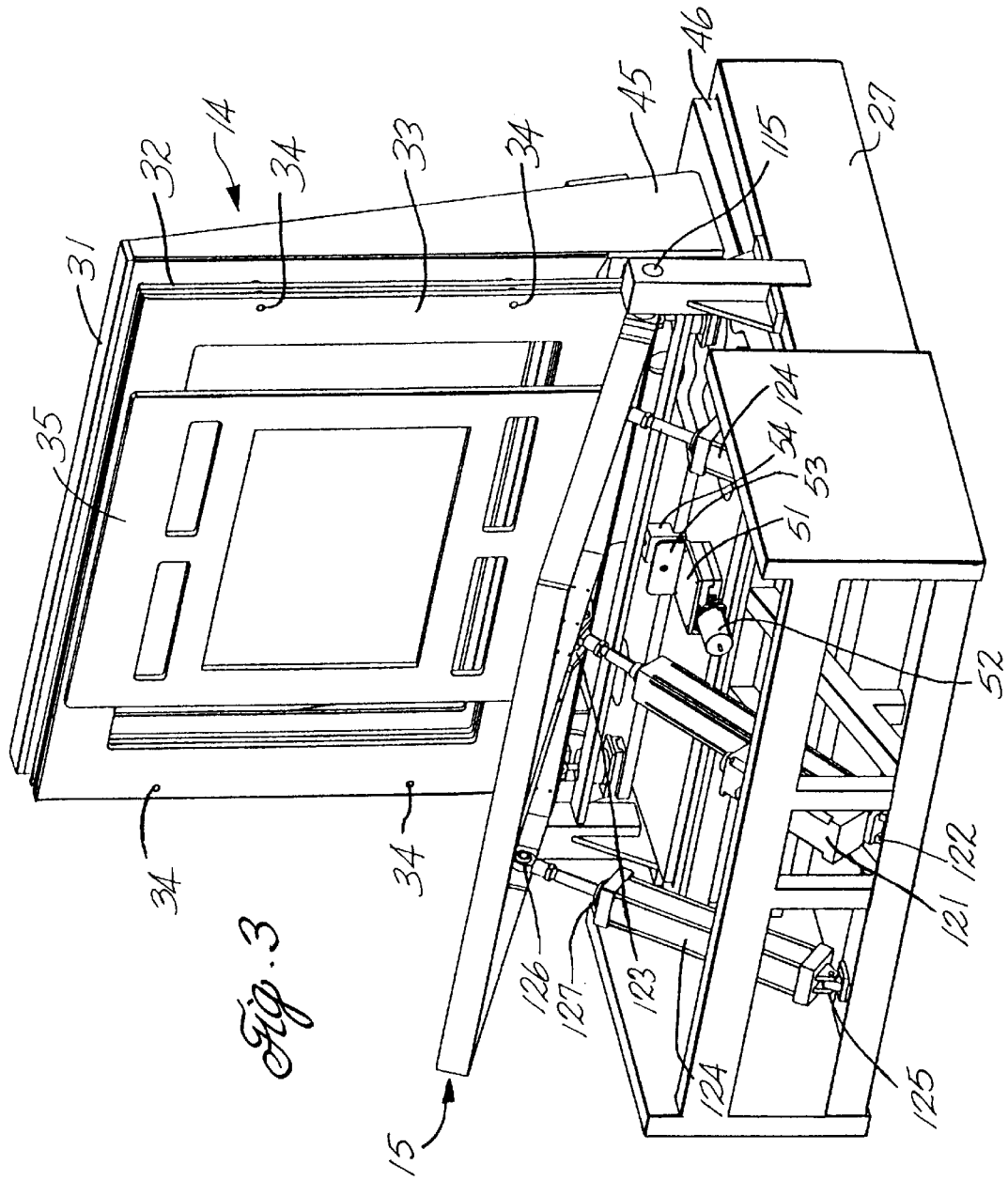
FIG. 3 is a front perspective view of the assemblies of FIG. 2 with the platen assembly partially tilted.

As is best illustrated in FIG. 3, the back frame is moved up and down the ramp in the direction of the z-axis along the slide bearings by a z-axis positioning table 51 mounted to the base. Such positioning tables are well known in the art. The z-axis positioning table is manipulated by a stepper motor 52 which moves a bumper 53 along the z-axis. The bumper pushes against a shock absorbing plate 54 mounted on the lower portion of the back frame. However, the bumper and shock absorbing plate are not directly coupled to one another.

In the preferred embodiment, precise spacing between the mask and substrate is achieved by the use of four shims (not shown) placed at the corners of the mask. The use of such shims is known in the art of proximity photolithography and provides an inexpensive yet reliable means for precisely spacing the mask and substrate. Preferably the shims are made of Mylar and are used to space the mask and substrate about 0.1 to 0.2 millimeters from one another. Other means for precisely placing the mask and substrate into proximity with one another include the use of gap sensors which can be used to control movement of the mask by controlling the z-axis positioning table.

While contact lithography generally provide a more precise exposure of a single substrate using a particular mask, proximity photolithography is preferred for the present application as a single mask can be used to more reliably expose a large number of substrates. Contact photolithography methods are generally unreliable for large runs of substrate as the repeated physical contact between the mask and substrates tends to either mar the surface of the mask or contaminate its surface with the chemical coatings from the substrate, either or which will reduce the quality of subsequent exposures. However, the fundamental equipment used in practicing the present invention could easily be modified for contact photolithography by the elimination of the shims.

Figure 5:
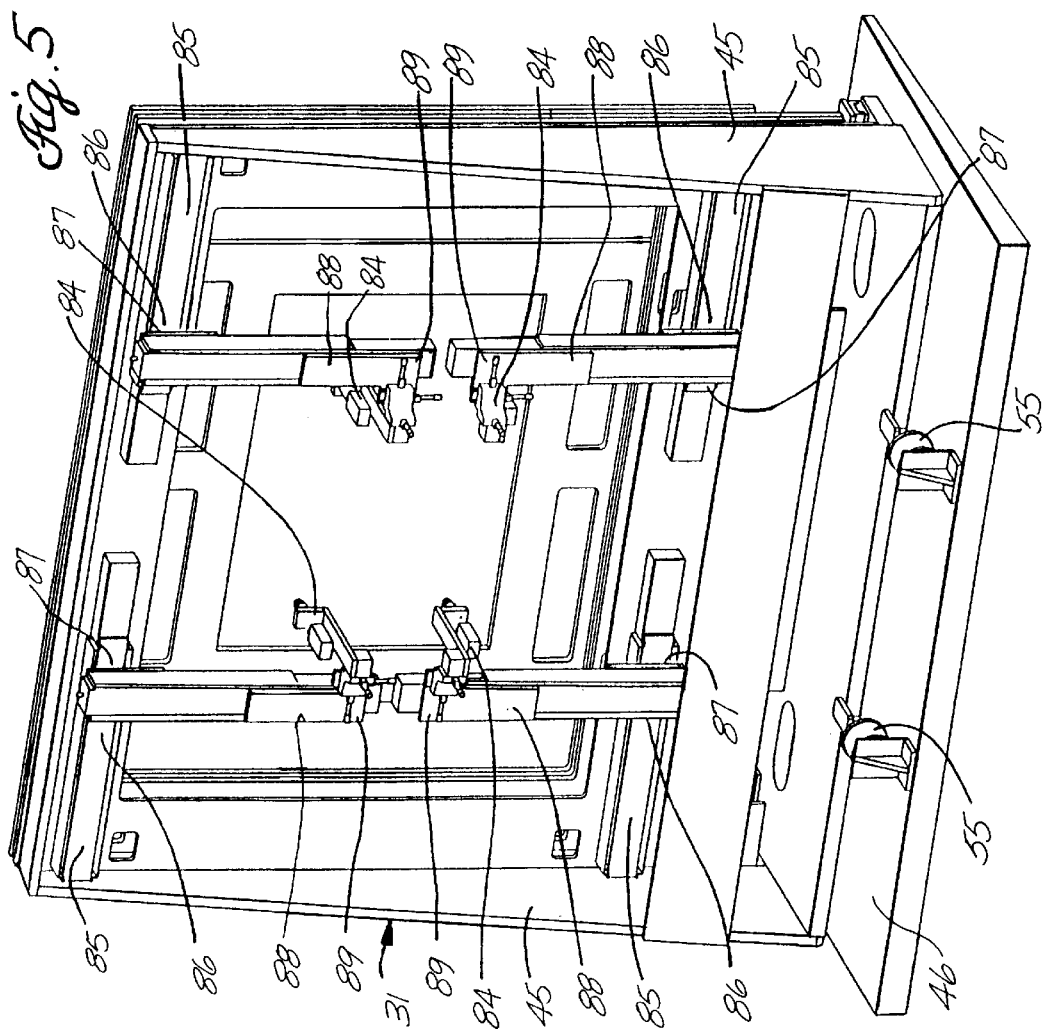
FIG. 5 is a rear perspective view of the frame assembly.

As is best illustrated in FIG. 5, in order to reduce the load on the z-axis positioning table, a pair of pneumatic counterbalances 55 are provided behind the frame. The z-axis counterbalances are anchored to the base frame and coupled to the slide plate of the mask frame. The z-axis counterbalances apply a force in a direction up the slope of the ramp in order to take a portion of the load off the z-axis stepper motor. Air pressure is supplied to the pneumatic cylinders through a pressure regulator (not shown). Preferably, after a mask has been affixed to the mask frame, the pressure regulator feeding the pneumatic counterbalances is manually adjusted to provide just enough air pressure to begin to move mask frame up the ramp. The pressure is then reduced slightly so that the z-axis stepper motor carries a small load.

In the preferred embodiment, the back frame and the front frame are coupled to one another such that some amount of movement of the front frame is permitted with respect to the back frame without the front frame deviating from its plane. This is useful for those applications in which a particular substrate must be exposed to more than one different mask. When a substrate is to receive two or more patterns by exposure to two or more different masks it is imperative that the different exposures be in precise alignment with one another. By permitting movement between the front and back frames, such precision can be achieved.

Figure 4:
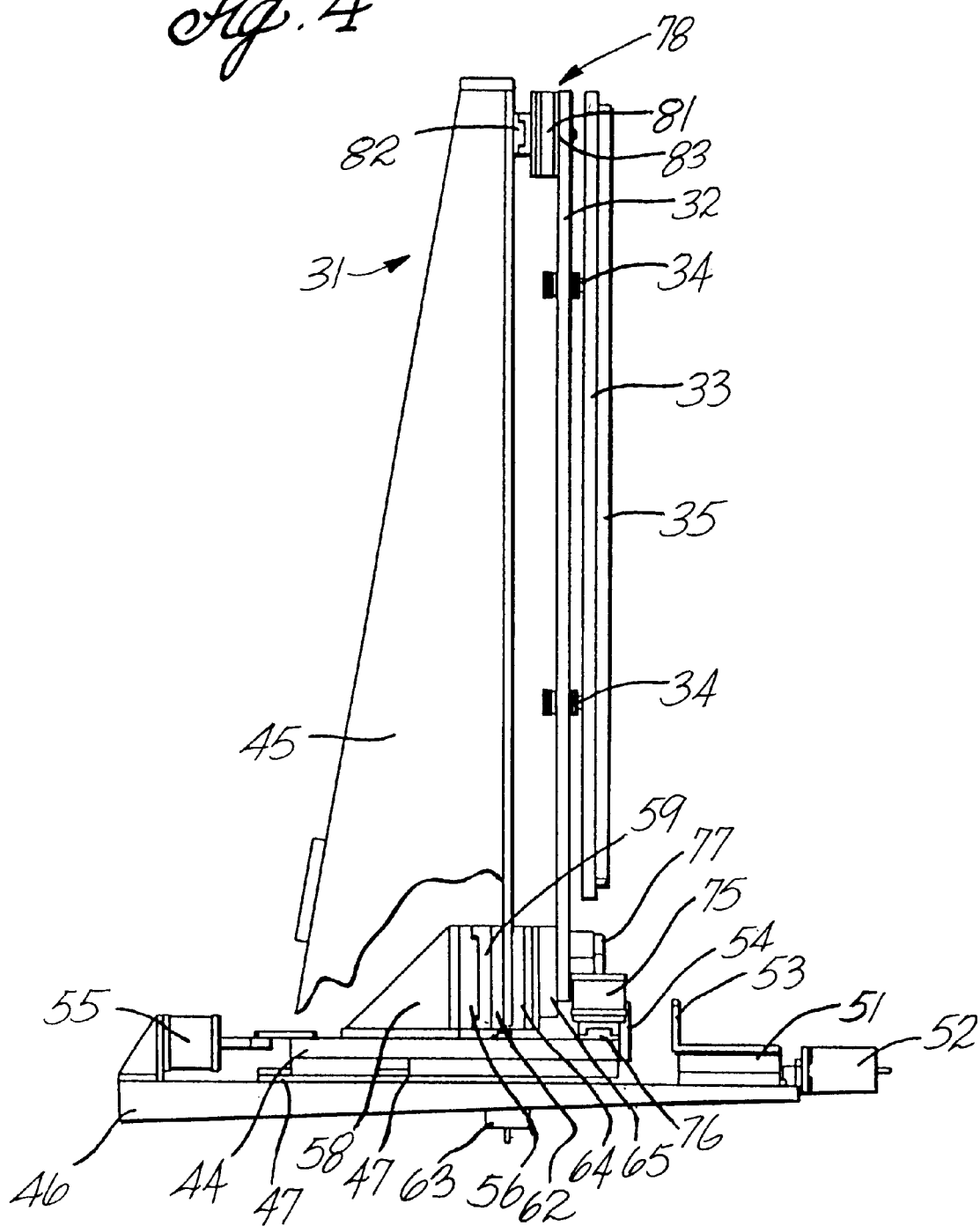
FIG. 4 is a side elevation view of the mask frame assembly.
Figure 6:
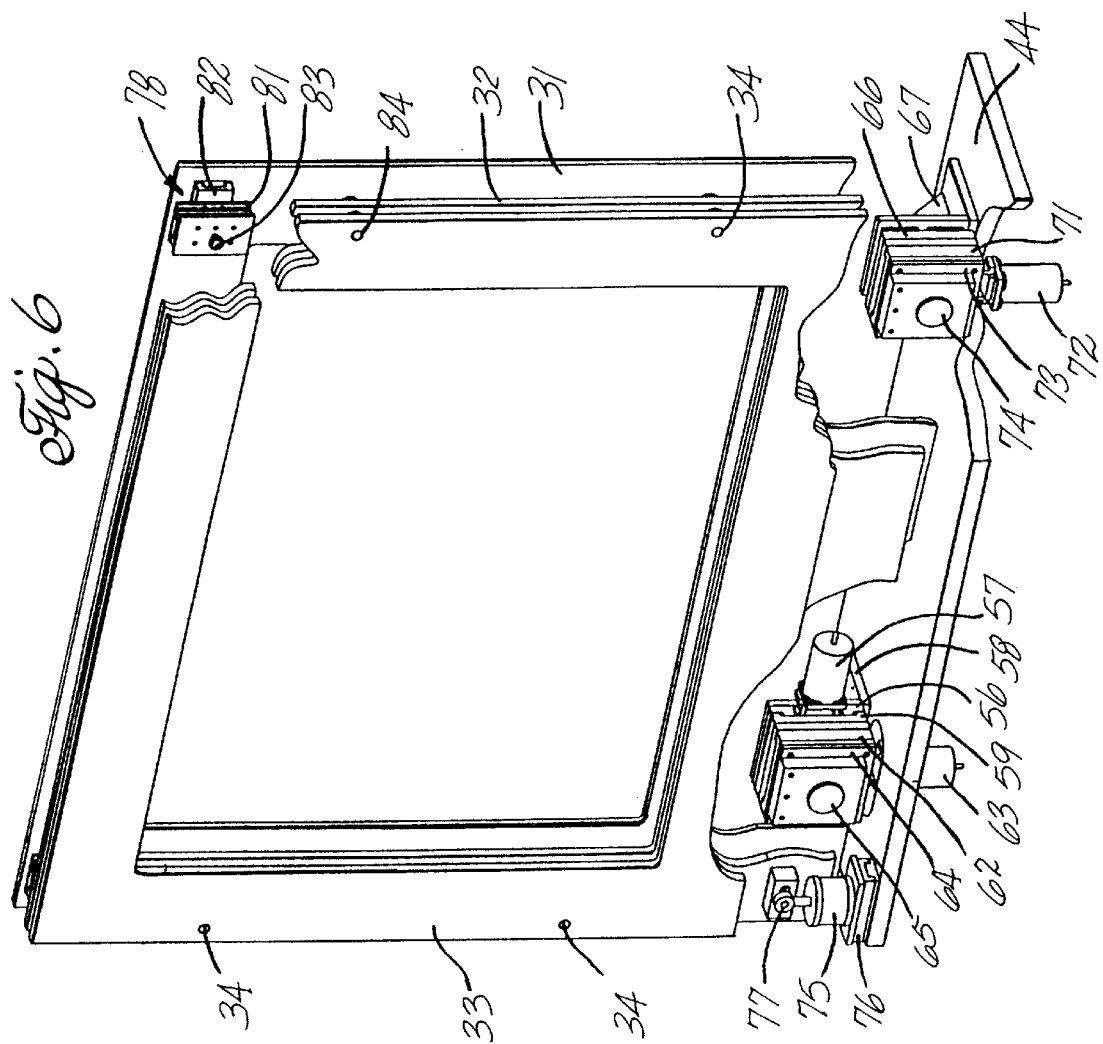
FIG. 6 is a front perspective view of the slide plate and front frame with a portion of the back frame removed.

Referring to FIGS. 4 and 6, three different positioning tables are provided to permit the manipulation of the front frame with respect to the back frame. An x-axis positioning table 56 driven by an x-axis stepper motor 57 is anchored to the left side of the slide plate of the back frame at a first mounting bracket 58. Operation of the stepper motor permits lateral movement of an x-axis positioning plate 59 with respect to the back frame. A $y_1$-axis positioning table 62 driven by a $y_1$-axis stepper motor 63 is mounted to the x-axis positioning plate. Operation of the $y_1$-axis stepper motor causes up and down movement of a $y_1$-axis positioning plate 64. The $y_1$-axis positioning plate is mounted to the front frame by a first ball bearing assembly 65 which permits angular movement between the front frame and the x- and $y_1$-positioning table assembly.

An x-axis slide bearing 66 is mounted to the right side of the slide plate of the back frame at a second mounting bracket 67. A $y_2$-axis positioning table 71 driven by a $y_2$-axis stepper motor 72 is anchored to the x-axis slide bearing. The x-axis slide bearing permits lateral movement of the $y_2$-axis positioning table with respect to the front frame. Operation of the $y_2$-axis stepper motor causes up and down movement of a $y_2$-axis positioning plate 73. The $y_2$-axis positioning plate is mounted to the front frame by a second ball bearing assembly 74 which, similar to the first ball bearing assembly, permits angular movement between the front frame and the y$_2$-axis positioning plate.

A pair of pneumatic lift cylinders 75 are provided between the slide plate of the back frame and the front frame to help relieve some of the weight of the front frame and mask so as to reduce the load on the y$_1$- and y$_2$-axis positioning tables. The pneumatic lift cylinders are fed with compressed air through a pressure regulator (not shown) which is adjusted to reduce the load carried by these positioning tables. Each pneumatic lift cylinder is mounted to the slide plate by a x-axis slide bearing 76 to permit lateral movement caused by the manipulation of the front frame. The pneumatic lift cylinders are coupled to the front frame by clevis joints 77 to accommodate any rotational movement between the front frame and the pneumatic cylinders caused by manipulation of the front frame.

In order to maintain planarity and rigidity of the front frame while still permitting the manipulation of the front frame with respect to the back frame, The upper right and left sides of the front frame and back frame are coupled to one another with a stacked bearing assembly 78. Each stacked bearing assembly includes a y-axis slide bearing 81 mounted to the front frame. To the y-axis slide bearing is mounted an x-axis slide bearing 82. The x-axis slide bearing is mounted to the back frame by a ball bearing assembly 83. Such an assembly permits motion between the front frame and back frame along the x-axis and the y-axis as well as permitting rotational movement between the frames. However, while the use of the stacked bearing assembly permits such movement, it does so without allowing any movement between the front and back frames in the direction of the z-axis.

Referring again to FIG. 5, the back plate further includes four retractable optical sensors 84 mounted at each of the four corners of the back plate. The optical sensors are useful for determining the alignment between targets on a mask and substrate where such alignment is important. Each optical sensor is mounted to its respective corner by a stacked positioning table assembly 85 which uses stepper motors to manipulate the optical sensor into an appropriate position for viewing its particular targets. Each stacked positioning table includes a horizontal positioning table 86 mounted to the back frame to permit horizontal movement of a horizontal positioning plate 87. A vertical positioning table 88 is mounted to each of the horizontal positioning plates to permit vertical movement of a vertical positioning plate 89. An optical sensor is mounted on each vertical positioning plate.

The stacked positioning tables permit the optical sensors to be moved into the proper position for measuring the alignment of the targets while permitting the optical sensors to be retracted so that they will not interfere with the exposure of the substrate. The stacked positioning tables provide sufficient mobility of each optical sensor to accommodate a broad range of different sized masks. The stepper motors of the stacked positioning tables for the optical sensors and the optical sensors themselves are preferably interfaced to the microprocessor for automatic control.

It should be noted that where a substrate is only exposed to a single mask, precise alignment between the mask and substrate is not generally necessary and the use of a mask frame having a front frame movable with respect to the back frame may be omitted. For such an embodiment, the planarization frame may be mounted directly to the back frame. Similarly, for such an embodiment, the optical sensors are not generally necessary and may be omitted.

Figure 7:
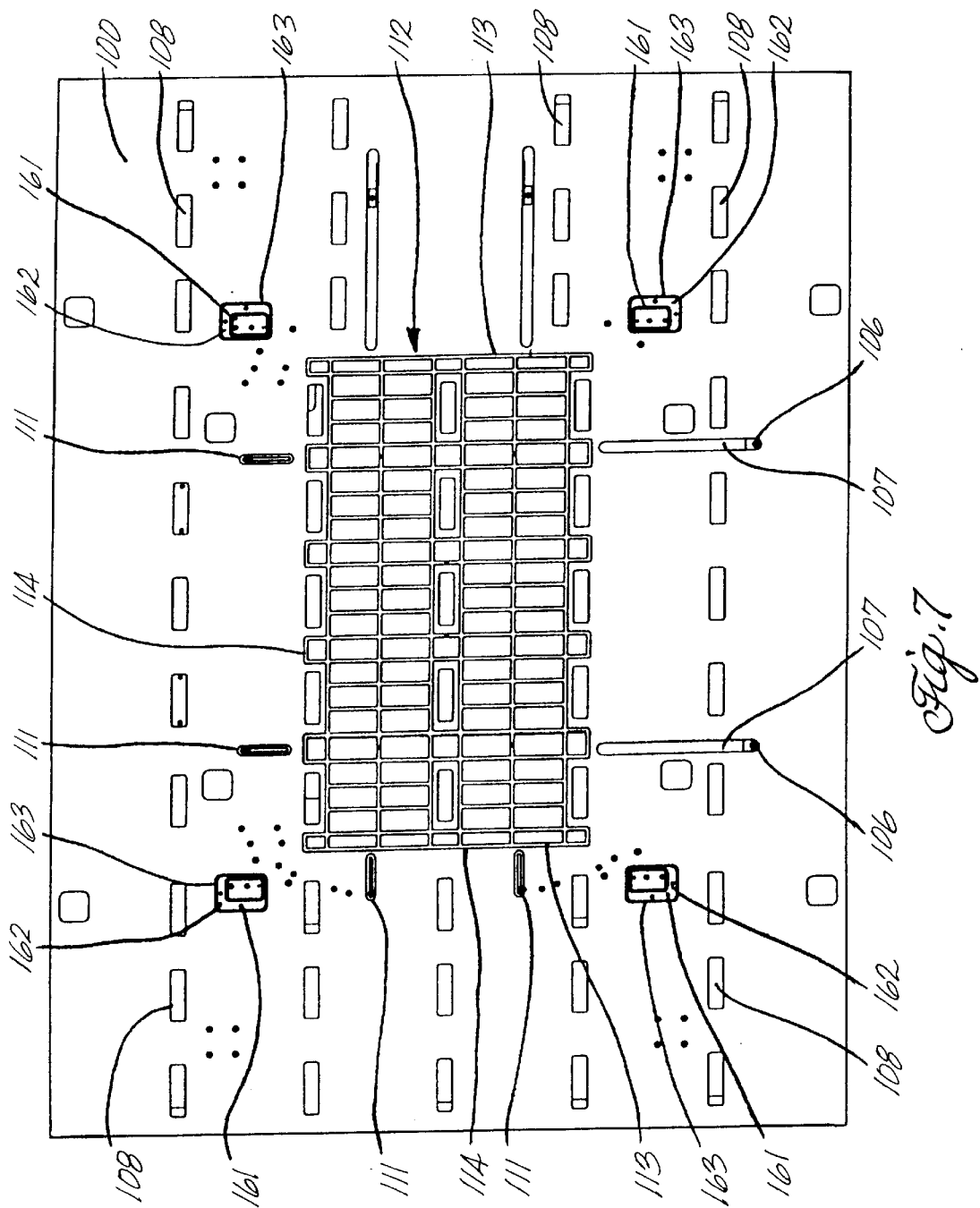
FIG. 7 is a plan view of the chuck plate.
Figure 8:
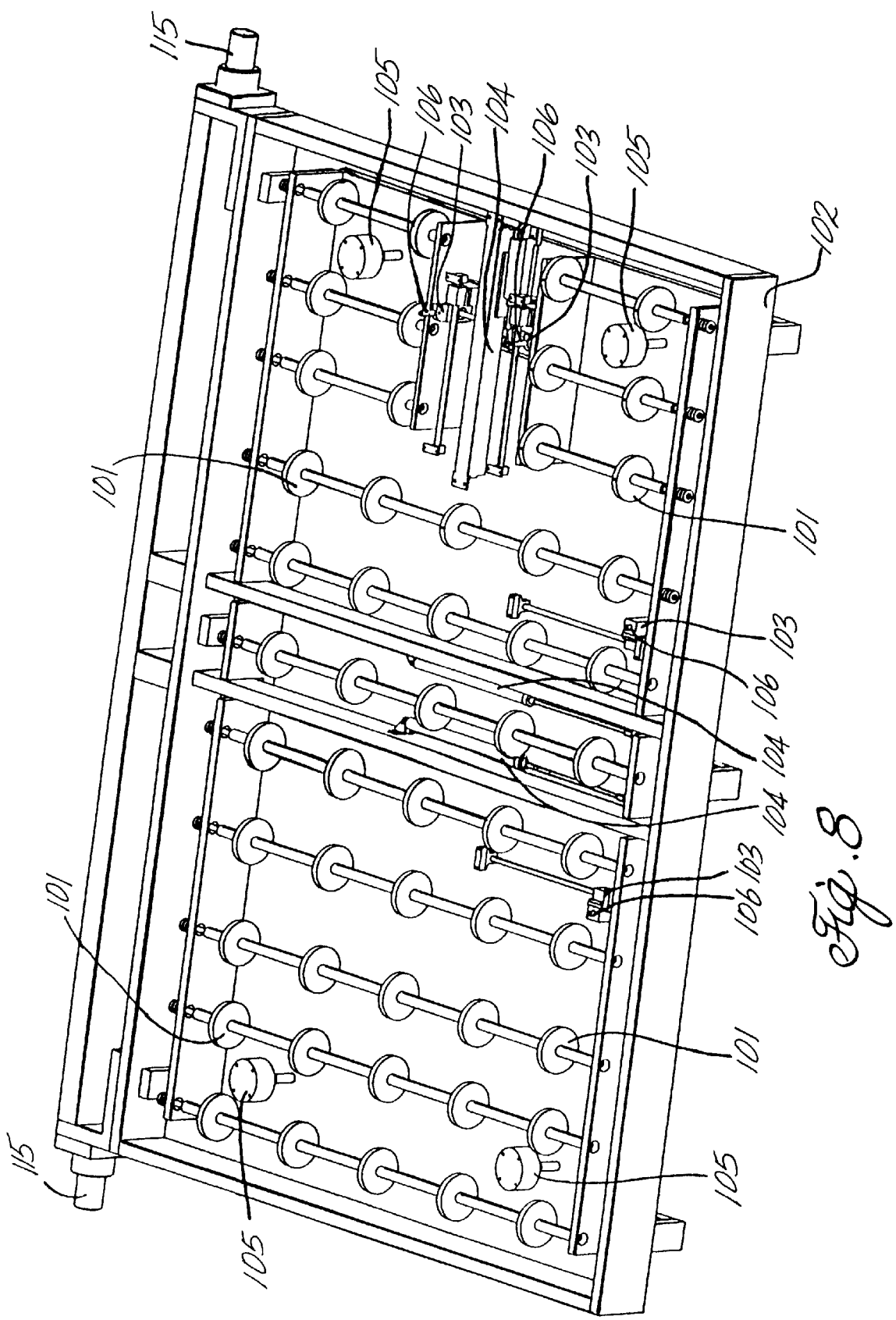
FIG. 8 is a perspective view of the platen with the chuck plate removed.

Referring to FIGS. 1, 7, and 8, adjacent the mask frame is provided a substrate platen 15. The platen includes a chuck plate 100, preferably made of aluminum, through which retractable drive wheels 101 can alternately extend and retract from a plurality of wheel apertures 108 in the chuck plate. Note that for the sake of clarity, in FIGS. 1–3, the details of the chuck plate are not provided. The retractable wheels are mounted on a rack 102 where they are coupled to one another by a drive belt and driven by a drive motor (not shown). These retractable drive wheels assist in the automatic manipulation of the substrate to the platen. The extension and retraction of the wheels is accomplished pneumatically by four pneumatic cylinders 105 bolted to the bottom of the chuck plate.

Two pairs of retractable snubbing pins 106 which extend through slots 107 in the chuck plate cooperate with two pairs of fixed banking pins 111 which extend through apertures 110 in the chuck plate to align a substrate on the surface of the platen. Once a substrate has been placed near the center of the platen by the drive wheels, the drive wheels retract to lower the substrate to the surface of the chuck plate. The snubbing pins which are movable along the slots, are then extended through the chuck plate by pneumatic extension cylinders (not shown) with the pins placed at the outermost ends of the slots. Once extended, pneumatic snubbing cylinders 104 located under the chuck plate are engaged to move the snubbing pins toward the banking pins, thereby moving the substrate toward the banking pins until the substrate abuts the banking pins. Because the banking pins are fixed, to avoid damaging the mask when the substrate is tilted to its exposure position, the banking pins extend up from the chuck plate less than the thickness of the substrate. By way of example, for a substrate 0.10 inches thick, the banking pins extend up about 0.075 inches. Once centered, both the pneumatic snubbing cylinders and the pneumatic extension cylinders are used to both move the snubbing pins away from the substrate and retract the pins from the chuck plate. By snubbing the substrate up against the banking pins, the substrate is properly positioned on the platen. It should be recognized that while the banking pins are described as fixed, their location can be adjusted manually so that the platen can be made to accommodate different sizes of substrates.

Once centered, the substrate is held in place on the chuck plate by a chuck which, in the preferred embodiment, is a vacuum substrate chuck 112 which includes a grid of vacuum channels 113 which extend over the surface of the chuck plate where the substrate is to be held. Preferably, the grid extends over a sufficient surface area of the chuck plate to firmly hold the substrate in place. Gasket strips 114 on either side of the channels assist in forming an airtight seal between the chuck plate and substrate. When a vacuum is applied to the vacuum channel by a vacuum source (not shown) the substrate is held firmly to the platen. While the chuck plate illustrated is for substrates somewhat smaller than the maximum size accommodated by the apparatus, it is apparent that the chuck plate can easily be modified to accommodate larger substrates. It should also be noted that while the substrate chuck will normally hold the substrate firmly in place, the banking pins provide support of the bottom of the substrate when it is in its tilted position as a backup against the failure of the vacuum system.

It is also important that since the chuck plate stays in contact with the substrate during its exposure, it should include a finish that prevents reflection of the exposure light which could adversely affect the quality of the finished substrate. Therefore, it is preferred that the chuck plate be provided with a finish such as a flat black paint to maximize its light absorbency. Since the chuck plate is preferably made of aluminum, a flat black anodized finish is preferred.

Referring to FIGS. 2 and 3, a pair of pivot pins 115 proximate the mask frame on either side of the rear edge of the platen mount the platen to the base in a hinged arrangement to permit the platen to be tilted to a position such that the substrate is substantially parallel to the mask. Preferred pivot pins are high load double row angular contact roller bearings which have very little play and, therefore, hold the substrate firmly in position to permit an accurate exposure. A servo-driven jack screw 121 located under the platen is used to lift the platen to its substantially vertical position. The jack screw is pivotally coupled to the base frame by a clevis joint 122 and to the platen frame by rod end joint bearings 123. In order to keep the reach of the jack screw short and thereby keep the profile of the device low, the rod end joint bearings are located fairly near the hinged edge of the platen. One trade-off of such a placement is that the load realized by the jack screw is higher than would be realized if this joint were located further from the hinge. Therefore, a pair of pneumatically-driven lift assists 124 are provided on either side of the jack screw at the right and left sides of the platen. Like the jack screw, each lift assist is pivotally coupled to the base frame by a clevis joint 125 and to the platen by a rod end joint bearing 126. When air pressure from a pressure source (not shown) is provided to pneumatic lift cylinders 127, the lift cylinders assist the jack screw in tilting the platen into position.

Referring again to FIG. 1, the substrate handling equipment further includes an in-feed conveyor 16 adjacent the platen. The in-feed conveyor is a horizontal table with a plurality of in-feed drive rollers 131 for moving substrate onto the platen. The in-feed rollers are coupled to one another by belts and are driven by a motor by means well known in the art. Two pairs of alignment pins 132 are provided on the in-feed table to perform an initial alignment of the substrate on the in-feed conveyor before the substrate is transferred to the platen. The alignment pins are moved using positioning tables (not shown) as are known in the art. An optional position sensor (not shown) can also be provided to determine the location of a substrate so that the microprocessor will know the location of a substrate during processing. The microprocessor can be used to stop the movement of the substrate along the in-feed conveyor if the platen is not ready for receiving it.

Similar to the in-feed conveyor, an out-feed conveyor 17 is provided adjacent the platen. Like the in-feed conveyor, it is a horizontal table with a plurality of out-feed drive rollers 133. The out-feed rollers are coupled to one another by belts and are driven by an motor by means well known in the art and are used to assist in moving an exposed substrate from the platen to an area for further processing.

Figure 9:
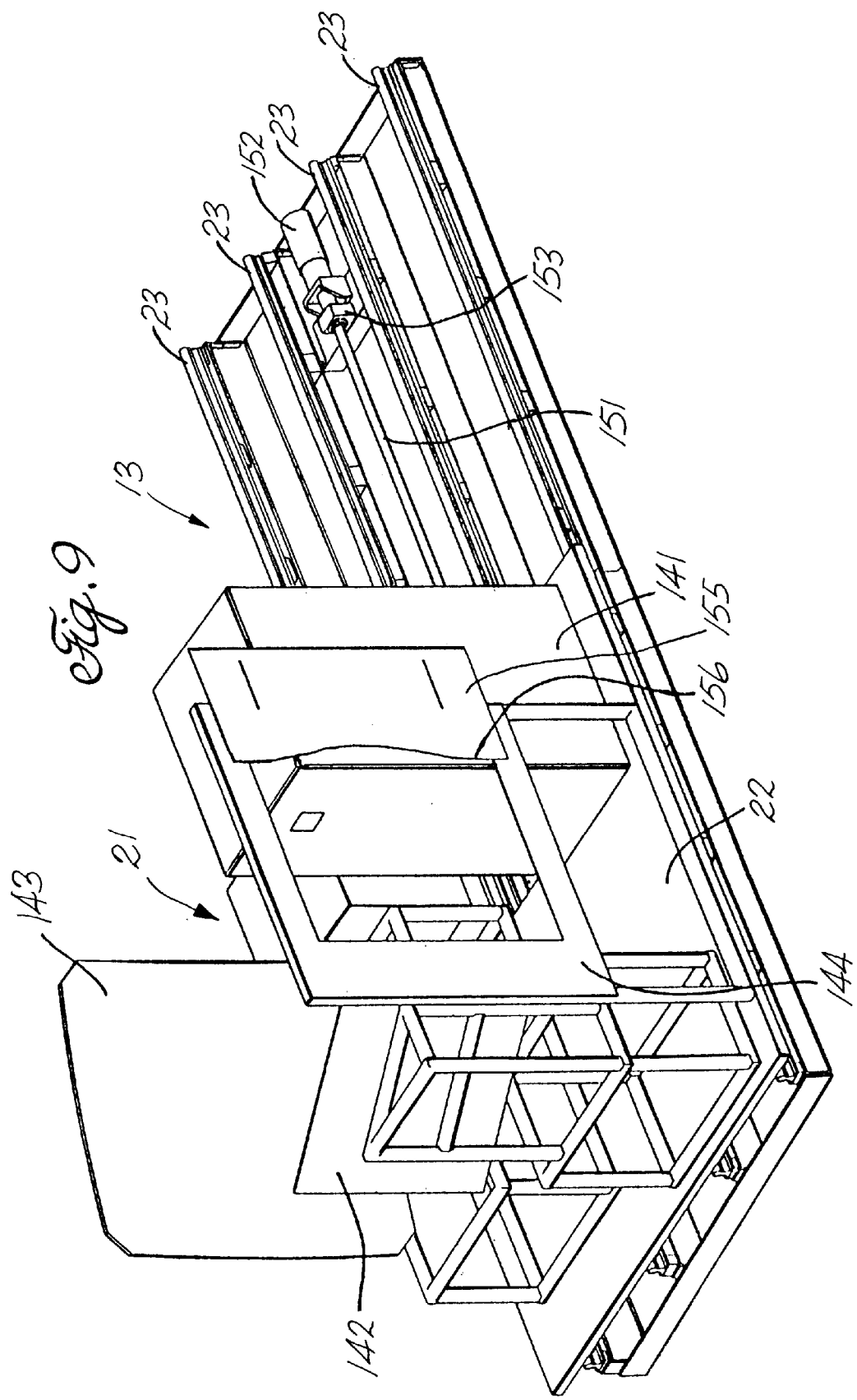
FIG. 9 is a front perspective view of the scanning assembly.
Figure 10:
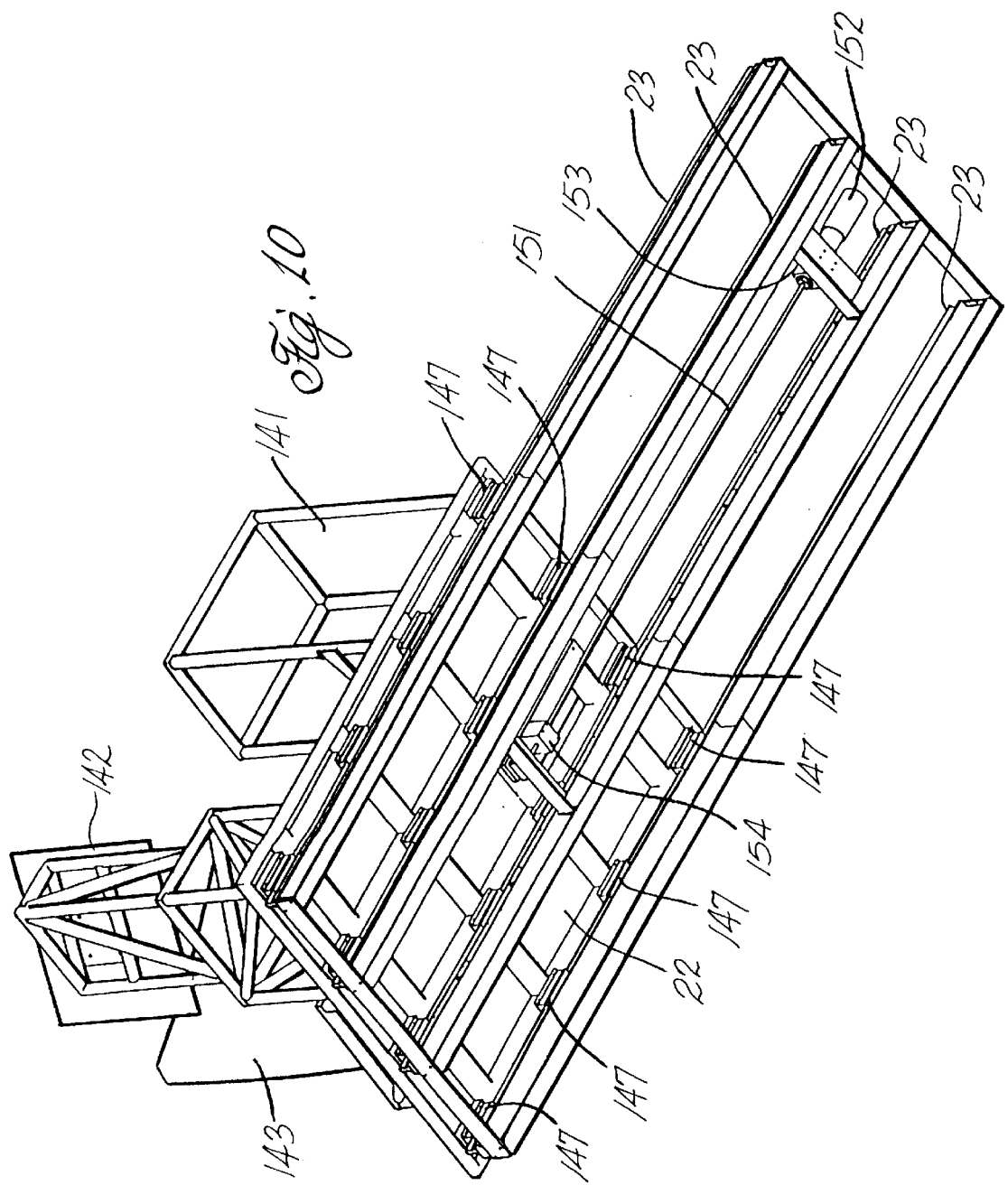
FIG. 10 is a bottom perspective view of the scanning assembly.

Turning to FIGS. 9 and 10, the scanning assembly 13 includes equipment for generating a collimated beam of light as is generally known in the art. This equipment specifically includes a lamphouse 141 containing an eight kilowatt UV lamp for generating a beam of ultra violet light. The beam of light from the lamphouse is directed to a reflecting mirror 142 where it is reflected to a collimating mirror 143 for producing the collimated beam of light. The collimated light beam is then directed through a rectangular aperture assembly 144, also mounted to the shuttle.

This equipment for generating the collimated beam of light is mounted on a shuttle 22 which, in turn, is mounted on four parallel rails 23. By using four rails, the stability of the shuttle is improved. In the event the rails are not be exactly parallel to one another, it is preferred that the shuttle be mounted to the rails with ball bushing bearings 147. These permit the shuttle to smoothly travel along the tracks despite any slight errors in alignment between the tracks.

The shuttle is driven along the rails by a rotating lead ball screw 151 which is driven by a servo motor 152. A three to one ratio gear box 153 is provided so that three turns of the motor will result in one turn of the screw shaft. A ball nut 154 mounted on the bottom of the shuttle couples the shuttle to the lead ball screw. The speed of the servo motor, and therefore, the length of the exposure, can be carefully controlled by the microprocessor to ensure accurate exposure of the substrates. Moreover, the speed of the servo motor can also be used to automatically compensate for any changes in the intensity of the collimated light beam as can occur with the aging of the lamphouse element.

The entire light source equipment is oriented so that the collimated light beam is perpendicular to the mask and substrate. In this embodiment, the tracks are arranged to carry the shuttle at a two degree angle from horizontal so that the collimated light beam is parallel to the z-axis.

If the collimated light beam were able to provide a beam of precisely uniform intensity at all points of the exposure field, then a rectangular aperture would provide uniform exposure of the substrate. However, for a large collimated light beam such as that used in the present invention for the single pass exposure of a large substrate, it is difficult to achieve such precise beam intensity. Therefore, in order to correct for any variations in the beam intensity, an aperture adapter 155 with a shaped inner edge 156 is provided to modify the shape of the aperture.

In order to properly shape the inner edge of the aperture adapter, testing should be conducted to determine the energy of exposure at various points from the top of the exposure field to the bottom of the exposure field over the course of a scan. It should be apparent that since the shuttle is moved at constant speed with the total beam energy constant during a scan, there should be no variation in the energy of exposure across a horizontal line of the exposure field. Any variations will be in the vertical direction. By adjusting the shape of the curve of the inner edge of the aperture adapter, the exposure can be modified to correct the exposure to be within required uniformity limits. A different aperture adapter with its own specific geometry for the inner edge will generally be required for each installation based on minor differences between the different lamphouses and the other equipment that make up a specific scanning assembly. Periodic retesting and subsequent modification of the aperture adapter may also be required over the life of the lamp and other equipment.

Figure 12:
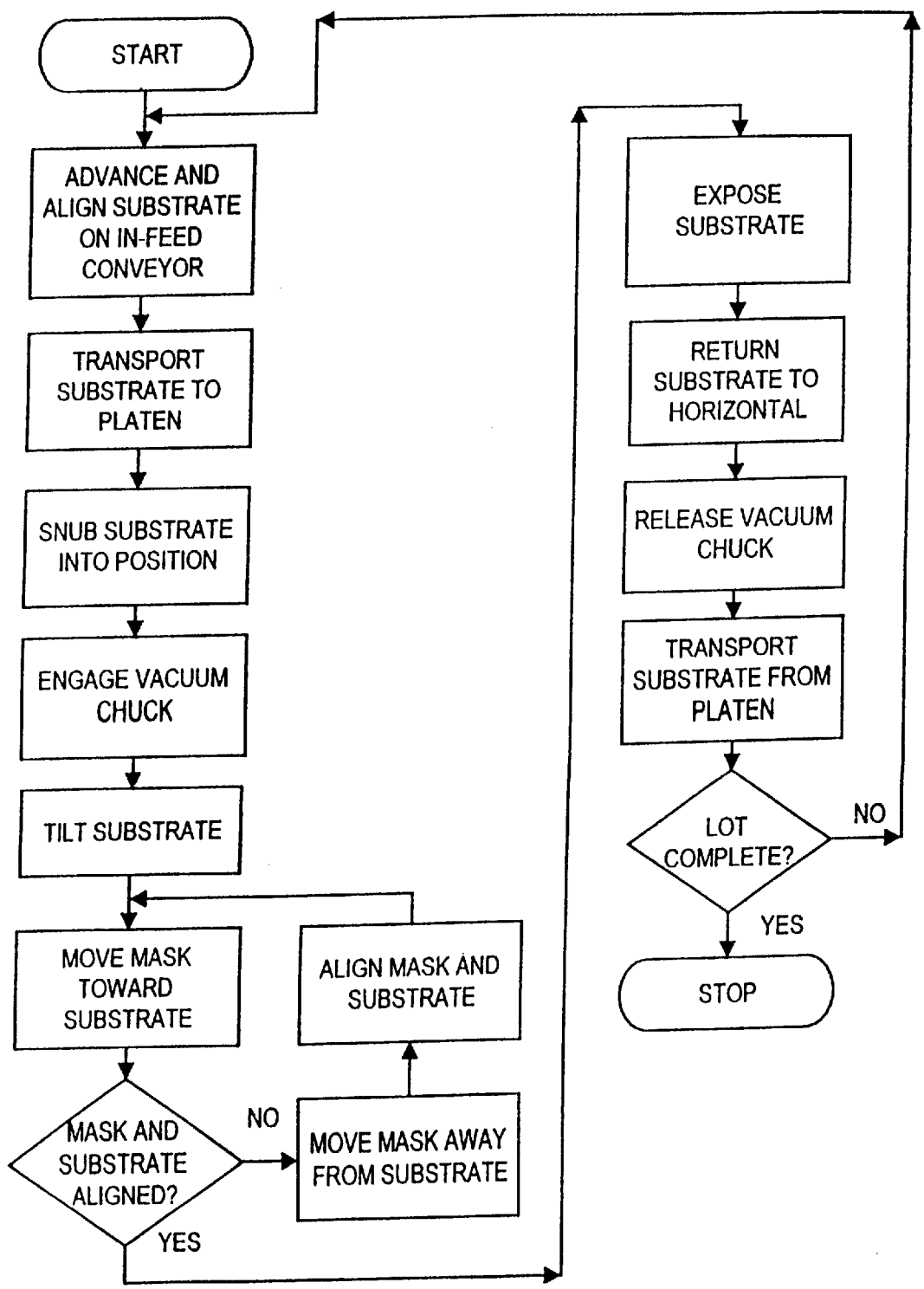
FIG. 12 is a flow diagram illustrating a photolithography method using the present apparatus.

The use of the equipment will now be described with reference to the flow diagram of FIG. 12. A first photoresist-coated substrate is drawn by the in-feed rollers of the in-feed conveyor toward the platen until a position sensor senses the substrate and sends a signal to the microprocessor which then stops further movement of the substrate by the rollers. The alignment pins of the in-feed roller are then extended and engaged to center the substrate on the in-feed conveyor. Once centered, the pins are retracted. When the platen is ready for receiving the substrate, the in-feed rollers are again engaged and the retractable wheels of the platen are extended and driven to assist in transporting the substrate to the platen. Position sensors on the platen are used to determine its location and stop further advancement of the substrate once it has advanced to a position near the center of the platen. The retractable wheels are then retracted so as to set the substrate directly on to the surface of the chuck plate. The snubbing pins are then extended through the chuck plate and moved along their respective slots in order to precisely center the substrate on the platen. The snubbing pins are then retracted and a vacuum is applied to the substrate chuck to hold the substrate in place on the chuck plate.

Once the substrate has been secured by the substrate chuck, the servo-driven jack screw and lift assists are engaged to tilt the platen to its substantially vertical position. Once this position has been reached, the z-axis stepper motor is engaged to move the mask toward the substrate by sliding the mask frame down the ramp until the shims on the face of the mask abut the substrate.

At this point, if necessary, the alignment of the mask and substrate is checked and corrected. This step is generally required where multiple exposures are to be made on a single substrate. Either prior to exposure, or during the first exposure of the substrate, it is necessary that one or more targets be exposed on the surface of the substrate. Preferably, four targets are provided, one at each of the four corners of the substrate. The optical sensors are moved into an appropriate position for checking the alignment using their respective stacked positioning tables and the alignment is checked. If the mask and substrate are not aligned, the z-axis stepper motor is engaged to move the mask and substrate apart and the stepper motors associated with the x-, $y_1$- and $y_2$-axis positioning tables are manipulated to adjust the front frame until the mask is in alignment with the substrate. The z-axis stepper motor is again engaged to move the mask and substrate into proximity with one another and another alignment check is made to either confirm that acceptable alignment has been achieved, or determine additional manipulation of the x-, $y_1$- and $y_2$-axis positioning tables to achieve alignment.

Once the mask and substrate are aligned, the optical sensors are retracted, the lamp house is energized and the shuttle servo motor is engaged to begin scanning the substrate with the collimated light beam. Once the exposure is complete, the lamphouse is de-energized, the z-axis stepper motor is engaged to separate the mask from the substrate and the platen is returned to the horizontal position. The vacuum chuck then releases the substrate and the drive wheels are extended and driven to move the exposed substrate from the platen to the out-feed rollers of the out-feed conveyor.

While the exposed substrate is being removed from the platen, a new substrate can be transported onto the platen in preparation for its exposure. The entire process is then repeated until the lot has been completed. As pointed out earlier, in order to improve the efficiency of the method, the direction of the shuttle movement during exposure is preferably alternated for subsequent substrate exposures. If a first substrate is scanned by the shuttle moving in a left-to-right direction, the next substrate is scanned by the shuttle moving in a right-to-left direction.

Yet another benefit of the present invention is that the tiltable platen can be used to simplify the loading of a mask to the mask frame. The platen includes four retractable mask loading chucks 161 for this purpose, as illustrated in FIG. 7. Each mask loading chuck includes a vacuum channel 162 with walls lined by gaskets 163. When a vacuum is applied to the four mask loading chucks, the mask is held firmly to the platen. The retractable mask loading chucks are oriented on the table to hold the mask by its corners, away from the artwork on the mask. The mask loading chucks, while normally in a retracted position, are extended for loading a mask. It is preferred that the mask not be laid in direct contact with the surface of the platen, but rather, be held by its four corners at the four mask loading chucks in order to prevent the mask from being damaged or contaminated by contact with the platen.

Once positioned on the platen and held by the four mask loading chucks, the platen is tilted upward as is done for a substrate. Once tilted, the z-axis stepper motor is used to lower the mask frame down the ramp until either the planarization frame or the adapter frame, if one is being used, comes into physical contact with the mask. The mask chuck of the mask frame is then engaged and the mask loading chucks of the platen are released. The z-axis stepper motor is used to separate the platen from the newly loaded mask and the jack screw and pneumatic lift assists are used to lower the platen to its horizontal position. Without the use of the platen, it would be very difficult to manipulate a new mask into position in the mask frame.

Having thus described the preferred embodiment of the invention, it would be apparent to one of skill in the art that numerous revisions could be made without deviating from the intended spirit and scope of the invention. Therefore, the invention is intended to be defined not by the specific features of the preferred embodiment as disclosed, but by the scope of the following claims.

What is claimed is:

1. An apparatus for exposing a substrate to radiation comprising:

a mask adapted to provide an exposure pattern;

a frame adapted to hold the mask in a substantially vertical position;

a platen adapted to receive the substrate in a substantially horizontal position;

a chuck adapted to hold the substrate to the platen;

a jack adapted to tilt the platen in order to place the substrate in close proximity and substantially parallel to the mask;

a light source to emit radiation through the mask and onto the substrate in a direction substantially perpendicular to the substrate; and a shuttle adapted to move the light source in a linear path parallel to the mask thereby sweeping the substrate with the light source across the linear path in a single pass.

2. The apparatus of claim 1 further comprising means for adjustably positioning the mask and substrate while in close proximity to one another.

3. An apparatus for exposing a substrate to radiation comprising:

a mask adapted to provide an exposure pattern;

a frame adapted to hold the mask in a substantially vertical position;

a platen adapted to receive the substrate in a substantially horizontal position;

a chuck adapted to hold the substrate to the platen;

a jack adapted to tilt the platen in order to place the substrate in a position substantially parallel to the mask;

a light source to emit radiation through the mask and onto the substrate in a direction substantially perpendicular to the substrate;

a shuttle adapted to move the light source in a linear path parallel to the mask thereby scanning the substrate with the light source across the linear path; and means for positioning the mask and substrate in close proximity to one another, wherein the means for positioning the mask and substrate comprises:
a motor for moving the frame toward the platen; and
a plurality of shims for spacing the mask and substrate from one another.

4. The apparatus of claim 3 further comprising at least one rail upon which the shuttle is mounted in sliding engagement to move the light source along the linear path.

5. An apparatus for exposing a substrate to radiation comprising:
a mask adapted to provide an exposure pattern;
a frame adapted to hold the mask in a substantially vertical position;
a platen adapted to receive the substrate in a substantially horizontal position;
a chuck adapted to hold the substrate to the platen;
a jack adapted to tilt the platen in order to place the substrate in a position substantially parallel to the mask;
a light source to emit radiation through the mask and onto the substrate in a direction substantially perpendicular to the substrate;
a shuttle adapted to move the light source in a linear path parallel to the mask;
a plurality of horizontal rails upon which the shuttle is mounted in sliding engagement; and
a motor adapted to slide the shuttle along the rails.

6. The apparatus of claim 1 further comprising means for lifting the mask from a substantially horizontal position to the substantially vertical position.

7. The apparatus of claim 6 wherein the means for lifting the mask comprises the platen.

8. The apparatus of claim 1 wherein the frame is at an angle up to about 5 degrees from vertical.

9. The apparatus of claim 1 further comprising means for aligning the mask and substrate with respect to one another to achieve a desired alignment.

10. An apparatus for exposing a substrate to radiation comprising:
a mask adapted to provide an exposure pattern;
a frame adapted to hold the mask in a substantially vertical position;
a platen adapted to receive the substrate in a substantially horizontal position;
a chuck adapted to hold the substrate to the platen;
a jack adapted to tilt the platen in order to place the substrate in a position substantially parallel to the mask;
a light source emit radiation through the mask and onto the substrate in a direction substantially perpendicular to the substrate;
a shuttle adapted to move the light source in a linear path parallel to the mask;
a plurality of sensors for determining the alignment between a first plurality of targets on the mask and a second plurality of targets on the substrate;
means for calculating a misalignment of the mask based on the determinations of the sensors and the desired alignment; and
means for moving the mask to correct the misalignment.

11. An apparatus for exposing a substrate to radiation comprising:
a frame adapted to hold a mask in a substantially vertical position;
a platen adapted to hold the substrate in a substantially vertical position;
a radiation source capable of producing a radiation beam through the mask and onto the substrate in a direction substantially perpendicular to the substrate; and
a movable shuttle adapted to hold the radiation source while scanning the radiation beam along a linear path parallel to the substrate, thereby exposing the substrate with the radiation source in a single pass.

12. The apparatus of claim 11 wherein the platen is tiltable from a first substantially horizontal position to a second substantially vertical position.

13. The apparatus of claim 13 further comprising a jack for moving the platen from the first position to the second position.

14. The apparatus of claim 11 further comprising means for aligning the mask and substrate with respect to one another to achieve a desired alignment.

15. The apparatus of claim 11 further comprising at least one rail upon which the shuttle is mounted in sliding engagement.

16. An apparatus for exposing substrate to radiation comprising:
a frame adapted to hold a mask in a substantially vertical position:
a platen adapted to hold the substrate in a substantially vertical position;
a radiation source capable of producing a radiation beam through the mask and onto the substrate in a direction substantially perpendicular to the substrate;
a movable shuttle adapted to hold the radiation source while moving the radiation bean along a linear path parallel to the substrate;
a plurality of sensors for determining the alignment between a first plurality of targets on the mask and a second plurality of targets on die substrate;
means for calculating a misalignment of the mask based on the determinations of the sensors and a desired alignment; and
means for moving the mask to correct the misalignment.

17. The apparatus of claim 11 wherein the frame is at an angle up to about 5 degrees from vertical.

18. The apparatus of claim 11 further comprising an aperture for modifying an exposure field of the radiation beam.

19. The apparatus of claim 16 wherein the frame and the platen are located in a first room and the radiation source and the movable shuttle are located in a second room.

20. A photolithography apparatus for exposing a photoresist-coated substrate to collimated light comprising:
a frame adapted to hold a photolithographic mask in a substantially vertical position, the frame being positioned at an angle up to about 5 degrees from vertical;
a tiltable platen adapted to move the substrate between a first substantially horizontal position and a second substantially vertical position;
a jack adapted to tilt the substrate frame from the first position to the second position;
a positioning mechanism adapted to position the mask and substrate in close proximity to one another;
a collimated light source capable of producing a collimated light beam through the mask and onto the substrate in a direction substantially perpendicular to the substrate; and
a movable shuttle adapted to hold the collimated light source while moving he collimated light beam along a linear path parallel to the substrate.

21. The photolithography apparatus of claim 20 further comprising:
   a rail upon which the movable shuttle moves; and
   means for moving the movable shuttle along the rail.

22. The photolithography apparatus of claim 20 wherein the positioning mechanism comprises:
   a motor for moving the frame toward the platen; and
   a plurality of shims for spacing the mask and substrate from one another.

23. The photolithography apparatus of claim 20 wherein the collimated light source and the movable shuttle are atmospherically isolated from the frame and platen.

24. The photolithography apparatus of claim 20 further comprising:
   a first conveyor adapted to move the substrate to the platen; and
   a second conveyor adapted to move the substrate from the platen.

25. The photolithography apparatus of claim 20 further comprising means for aligning the mask and substrate to one another to achieve a desired alignment.

26. A photolithography apparatus for exposing a photoresist-coated substrate to collimated light comprising:
   a frame adapted to hold a photolithographic mask in a substantially vertical position;
   a tiltable platen adapted to move the substrate between a first substantially horizontal position and a second substantially vertical position;
   a jack adapted to tilt the substrate frame from the first position to the second position;
   a positioning mechanism adapted to position the mask and substrate in close proximity to one another;
   a collimated light source capable of producing a collimated light beam through the mask and onto the substrate in a direction substantially perpendicular to the substrate;
   a movable shuttle adapted to hold the collimated light source while moving he collimated light beam along a linear path parallel to the substrate;
   a plurality of sensors for determining an alignment between a first plurality of targets on the mask and a second plurality of targets on the substrate;
   means for calculating a misalignment of the mask based on the determinations of the sensors and the desired alignment; and
   means for moving the mask to correct the misalignment.

27. The photolithography apparatus of claim 26 wherein the plurality of sensors comprise a plurality of optical sensors.

28. The photolithography apparatus of claim 26 wherein the means for moving the mask comprises:
   a first motor for moving a first side of the mask up or down in a substantially vertical plane defined by the mask;
   a second motor for moving a second side of the mask up or down in the substantially vertical plane; and
   a third motor for moving the mask laterally in the substantially vertical plane.

29. A photolithography apparatus for exposing a photoresist-coated substrate to collimated light comprising:
   a frame adapted to hold a photolithographic mask in a substantially vertical position;
   a tiltable platen adapted to move the substrate between a first substantially horizontal position and a second substantially vertical position;
   a jack adapted to tilt the substrate frame from the first position to the second position;
   a positioning mechanism adapted to position the mask and substrate in close proximity to one another;
   a collimated light source capable of producing a collimated light beam through the mask and onto the substrate in a direction substantially perpendicular to the substrate; and
   a movable shuttle adapted to hold the collimated light source while moving he collimated light beam along a linear path parallel to the substrate;
   whereby the frame and the tiltable platen are located in a first room and the collimated light source and the movable shuttle are located in a second room adjacent the first room.

30. An apparatus for exposing a substrate to radiation comprising:
   a frame adapted to hold a mask in a substantially vertical position;
   a platen adapted to hold the substrate in a substantially vertical position
   a radiation source capable of producing a radiation beam through the mask and onto the substrate in a direction substantially perpendicular to the substrate;
   a movable shuttle adapted to hold the radiation source while moving the radiation beam alone a linear path parallel to the substrate;
   a plurality of horizontal rails upon which the shuttle is mounted in sliding engagement; and
   a motor adapted to slide the shuttle along the rails.

\* \* \* \* \*